US009791641B2

(12) United States Patent
Heck et al.

(10) Patent No.: US 9,791,641 B2
(45) Date of Patent: Oct. 17, 2017

(54) INVERTED 45° MIRROR FOR PHOTONIC INTEGRATED CIRCUITS

(71) Applicants: John Heck, Berkeley, CA (US); Haisheng Rong, Pleasanton, CA (US)

(72) Inventors: John Heck, Berkeley, CA (US); Haisheng Rong, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/884,430

(22) Filed: Oct. 15, 2015

(65) Prior Publication Data

US 2016/0139350 A1    May 19, 2016

Related U.S. Application Data

(62) Division of application No. 13/536,723, filed on Jun. 28, 2012, now Pat. No. 9,195,007.

(51) Int. Cl.
| | |
|---|---|
| *G02B 6/12* | (2006.01) |
| *H01L 21/00* | (2006.01) |
| *G02B 6/26* | (2006.01) |
| *H01L 21/306* | (2006.01) |
| *G02B 6/42* | (2006.01) |
| *G02B 6/122* | (2006.01) |
| *G02B 6/136* | (2006.01) |

(52) U.S. Cl.
CPC .......... *G02B 6/4214* (2013.01); *G02B 6/122* (2013.01); *G02B 6/136* (2013.01); *G02B 6/26* (2013.01); *G02B 6/42* (2013.01); *G02B 6/4208* (2013.01); *H01L 21/30604* (2013.01); *G02B 2006/12104* (2013.01)

(58) Field of Classification Search
CPC .......... G02B 6/122; G02B 6/136; G02B 6/26; G02B 6/42; G02B 6/4208; G02B 6/4214; G02B 2006/12104; H01L 21/30604
USPC ................... 385/14, 31, 39, 49–52
See application file for complete search history.

(56) References Cited

U.S. PATENT DOCUMENTS

| | | | |
|---|---|---|---|
| 2005/0141808 A1* | 6/2005 | Cheben | G02B 6/12019 385/31 |
| 2011/0133063 A1* | 6/2011 | Ji | G02B 6/122 250/227.24 |

* cited by examiner

*Primary Examiner* — Akm Enayet Ullah
*Assistant Examiner* — Michael Mooney
(74) *Attorney, Agent, or Firm* — Blakely, Sokoloff, Taylor & Zafman LLP (57) ABSTRACT

Inverted 45° semiconductor mirrors as vertical optical couplers for PIC chips, particularly optical receivers and transmitters. An inverted 45° semiconductor mirror functions to couple light between a plane in the PIC chip defined by thin film layers and a direction normal to a top surface of the PIC chip where it may be generated or collected by an off-chip component, such as a wire terminal. In an exemplary embodiment, a (110) plane of a cubic crystalline semiconductor may provide a 45° facet inverted relative to a (100) surface of the semiconductor from which light is to be emitted. In further embodiments, a (110) plane may be exposed by undercutting a device layer of a semiconductor on insulator (SOI) substrate. Alternatively, a pre-etched substrate surface may be bonded to a handling wafer, thinned, and then utilized for PIC waveguide formation.

8 Claims, 8 Drawing Sheets

INVERTED 45° MIRROR FOR PHOTONIC INTEGRATED CIRCUITS

PRIORITY

The present patent application is a divisional application of patent application Ser. No. 13/536,723, titled "Inverted 45 Degree Mirror for Photonic Integrated Circuits", filed Jun. 28, 2012.

TECHNICAL FIELD

Embodiments of the invention are generally related to photonic integrated circuits (PICs), and more particularly pertain to vertical mirrors for vertical light emission and collection.

BACKGROUND

Monolithically integrated photonic circuits are useful as optical data links in applications such as, but not limited to, optical communications, high performance computing, and data centers. For mobile computing platforms too, a PIC is a useful means of I/O for rapidly updating or syncing a mobile device with a host device and/or cloud service where a wireless link has insufficient bandwidth. Such optical links utilize an optical I/O interface that includes an optical transmitter and an optical receiver. One challenge with the optical I/O interface is coupling light between monolithically integrated photonic circuits, which are fabricated on a micrometer scale, and separately packaged components (e.g., optical fiber, etc.) which are assembled on the millimeter scale. A PIC may utilize vertical or edge-based optical I/O coupling techniques. The edge coupling technologies have a substantial drawback in that device testing requires an edge to be provided, typically by singulating the substrate upon which the PIC was fabricated into individual PIC chips. The vertical coupling technologies, while advantageously amenable to "wafer-level" PIC testing, typically have lower coupling efficiency than do the edge technologies and may further suffer from polarization issues and wavelength dependence, as a function of the implementation.

Light travelling horizontally a waveguide is technically difficult to reflect with mirror surfaces because the redirected light tends to be off-normal (e.g., a (111) plane in (100) silicon forms a mirror facet at 54.7° from a (100) plane, or 19.4° off-normal). For such circumstances, the presence of a material having a sufficiently high refractive index is needed in the path of the redirected light to avoid total internal reflection (TIR) of the redirected light at the interface of the waveguide. For at least this reason, actually coupling light vertically out of (or into) a horizontally oriented waveguide in the absence of such high index materials poses technical difficulty.

A vertical coupling technique that offers vertically directed light coupling for a horizontally oriented waveguide having high efficiency would be advantageous in the provision of PICs, such as optical receivers and/or transmitters.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

Described herein are inverted 45° semiconductor mirrors as vertical optical couplers for PIC chips, particularly optical receivers and transmitters. In an exemplary embodiment, an inverted 45° semiconductor mirror is operable to couple light between a plane in the PIC chip defined by thin film layers and a direction normal to a top surface of the PIC chip where it may be generated or collected by an off-chip component, such as a wire terminal. In an exemplary embodiment where the semiconductor has cubic crystallinity, exposure of a (110) plane may provide a 45° facet inverted relative to a (100) surface of the semiconductor from which light is to be emitted. In further embodiments, a (110) plane may be exposed by undercutting a device layer of a semiconductor on insulator (SOI) substrate. Alternatively, a pre-etched substrate surface may be bonded to a handling wafer to invert the etched surface. The substrate may then be thinned and utilized for PIC waveguide formation.

In embodiments employing a crystalline semiconductor with a (100) orientation, preferential etching toward a (110) plane is promoted by orienting an etch mask opening approximately 45° from a conventional (100) oriented Manhattan layout. In further embodiments, a waveguide optically coupled to the facet is also routed at a 45° angle to orient the mode propagation into a (100) direction for good optical coupling of the (110) mirror facet.

Figure 1:
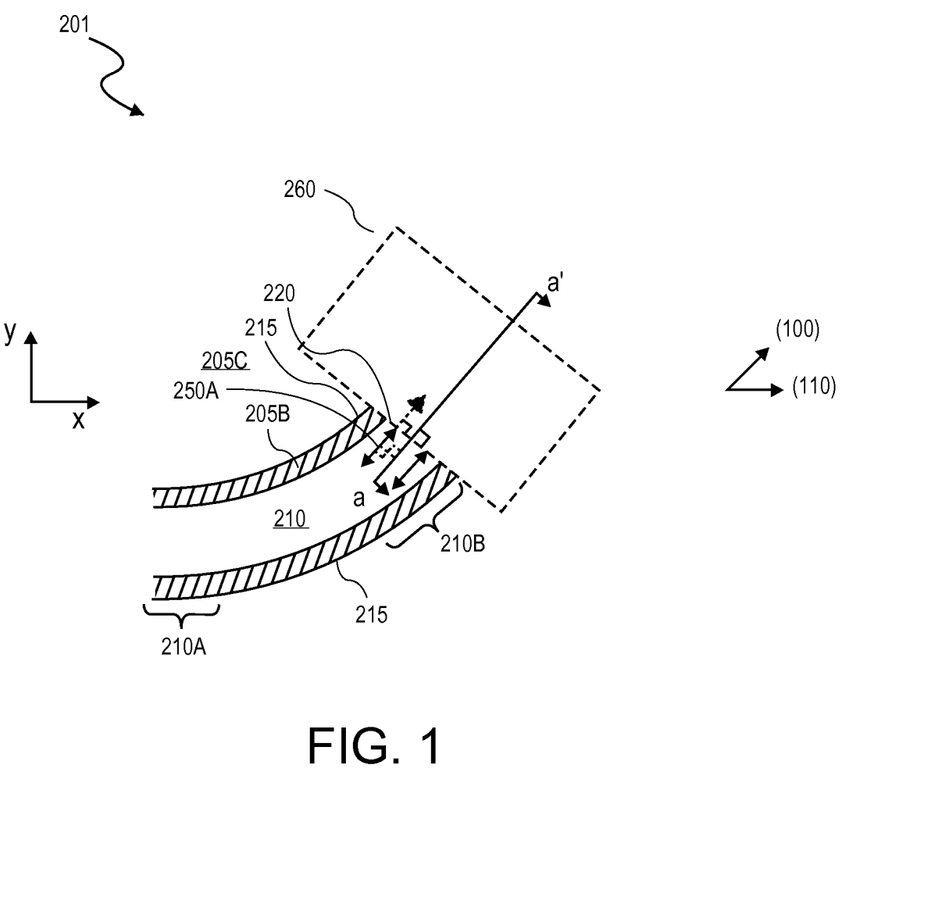
FIG. 1 is a plan view of a vertical coupler employing an inverted mirror facet, in accordance with an embodiment of the present invention.

FIG. 1 is a plan view of a vertical coupler 201 optically coupled to an optical waveguide 210. The optical waveguide 210 may further be coupled to any of one or more optical devices known in the art. Exemplary optical devices include electro-optical devices such as photodetectors, lasers, modulators, optical isolators, gratings, and the like, to operate on light propagated through the waveguide 210.

Figure 2A:
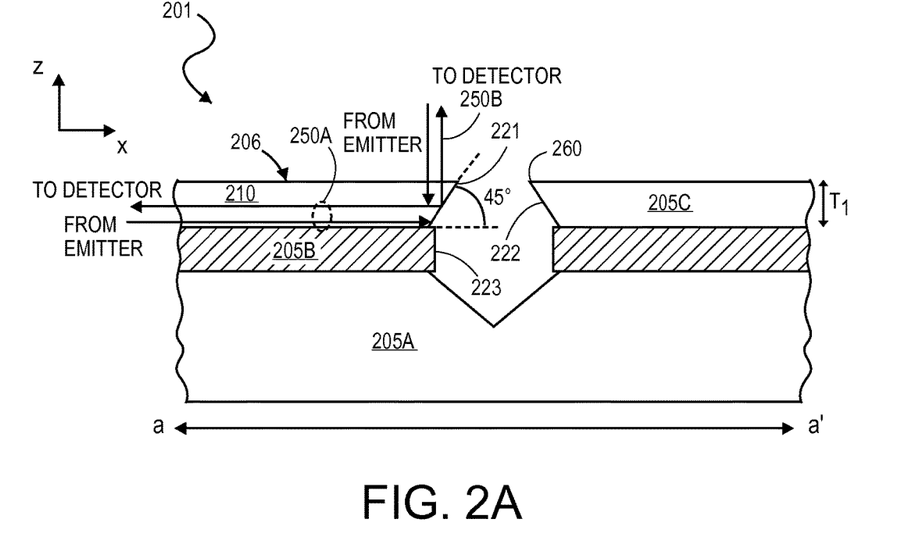
FIG. 2A is a cross-sectional view further illustrating the inverted mirror facet of FIG. 1, in accordance with an embodiment of the present invention.
Figure 2B:
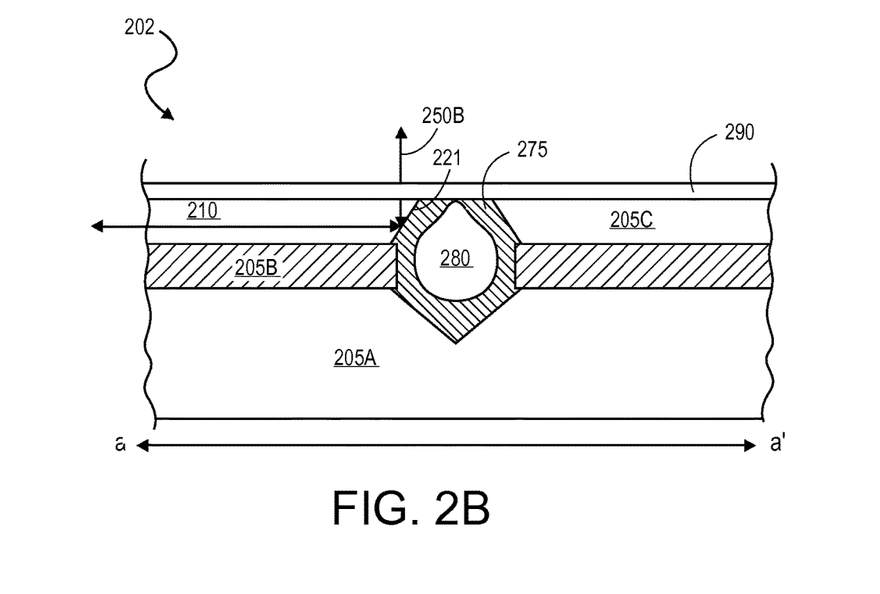
FIG. 2B is a cross-sectional view further illustrating the inverted mirror facet of FIG. 1, in accordance with an embodiment of the present invention.

In embodiments, the vertical coupler 201 employs an inverted mirror. A top mirror edge 220 is visible in FIG. 1 and is further visible as the mirror facet 221 in the cross-sectional view of FIG. 2A along the a-a' line illustrated in FIG. 1. As illustrated in FIGS. 2A and 2B, the mirror facet 221 is a facet within the device layer 205C that the waveguide 210 is formed, for example by patterning trenches 215 (FIG. 1) to define a route of optical mode propagation. Generally, the device layer 205C may be any crystalline semiconductor known in the art as being suitable for forming a waveguide. In the exemplary embodiments, the device layer 205C entails a substantially monocrystalline semiconductor having a cubic crystal lattice, which is diamond cubic in exemplary Si, Ge or SiGe embodiments, and may be zinc blend for compound III-V semiconductor embodiments. Generally, cubic crystallinity is leveraged in embodiments for setting the mirror facet 221 to a 45° degree orientation relative to a top device layer surface 206.

In embodiments, the device layer 205C has {100} crystallinity (or crystal orientation). As used herein, {100} crystallinity means a cubic crystal lattice is oriented with a [100] direction orthogonal to, or normal to, the top surface 206. In other words the top surface 206 is the (100) plane or a symmetrically equivalent plane (e.g., (001)). For silicon embodiments, the device layer 205C may therefore entail any <100> type silicon substrate, whether a bulk substrate, an epitaxially layer, or a bonded transferred layer. In an alternate embodiment, the device layer 205C has {110} crystal orientation with a [110] direction normal to the top surface 206.

As further shown in FIG. 1, the mirror facet 221 is oriented orthogonally to the direction of light propagation in an end portion 210B of the optical waveguide 210. The top mirror edge 220 is orthogonal to the waveguide propagated light 250A coupled into, or out of, the end waveguide portion 210A via the mirror facet 221. In embodiments with {100} crystallinity, at least the portion of the waveguide 210 optically coupled to the mirror facet 221 propagates light in the (100) direction. In the exemplary embodiment, the waveguide 210 includes a 45° degree turn between a first waveguide portion 210A, which propagates light in the (110) direction, and the end portion 210B, which propagates light in the (100) direction. While the exemplary embodiment employs the waveguide 210 to accommodate a 45° deviation from a Manhattan layout (orthogonal polygons aligned to a substrate notch or flat) for the sake of forming the mirror facet 221 with the desired orientation relative to the top surface 206, in other embodiments an entire PIC with Manhattan layout is rotated 45° to the substrate notch to have polygon feature dimensions parallel to the (110) direction.

As shown in FIG. 2A, the mirror facet 221 is 45° from normal of the device layer top surface 206 and also 45° from the in-plane waveguide propagated light 250A. In embodiments with {100} crystallinity, the mirror facet 221 is a crystalline facet on a {110} crystal plane of the device layer. As the mirror facet 221 is inverted, or re-entrant, with respect to the top surface 206, the mirror facet 221 is positioned with respect to the waveguide 210 to couple light into and out of the plane of the waveguide 210 (e.g., along first of the <100> directions parallel to top surface 206) and into and out of normal incidence with respect to the top surface 206 (e.g., along second of the <100> directions) where there is sufficient index contrast between the device layer semiconductor and a medium interfacing with the surface of the mirror facet 221 (e.g., vacuum or a dielectric such silica). In embodiments, the index contrast is sufficient for total internal reflection (TIR) at the mirror facet 221 leading to high coupling efficiency between the in-plane propagated light 250A and normally incident light 250B (shown in FIG. 2A). The vertical coupler 201 may therefore be utilized in various application where, for example, the normally incident/emitted light 250B may be received by the vertical coupler 201 from an off-chip emitter and/or emitted by the vertical coupler 201 to an off-chip detector. In-plane propagated light 250A may be received by the vertical coupler 201 from an emitter in the PIC of which the waveguide 210 is a part, or emitted by the vertical coupler 201 to a detector in the PIC. In an alternate embodiment with {110} crystallinity, the mirror facet 221 is a crystalline facet on a {100} crystal plane of the device layer, resulting in the same advantageous inverted 45° mirror facet structure.

As illustrated in FIG. 1, the mirror top edge 220 is a portion of one of the edges of a polygon defining an opening in the device layer top surface 206. As such, the mirror facet 221 is one side of a recess etched into the device layer 205C. The exemplary polygon 260, represented by dashed line in FIG. 1 because it may be below the top surface of the PIC 100, has rectangular sides defined by opposing edges of a plurality of {110} crystal planes corresponding to a truncated pyramid or diamond structure etched into the device layer 205C with one side of the recess structure forming an end facet of the waveguide 210. Depending on the implementation, the recess in the device layer 205C may be other polyhedrons, for example further including {111} crystal planes at corners where adjacent {110} planes meet.

In embodiments, a plurality of waveguides intersects at the recess in the device layer, for example one waveguide having and end facet at each side of the polyhedron. As shown in FIG. 2A for example, while the waveguide 210 ends at the mirror facet 221, a second waveguide in the device layer 205C may have an end at the mirror facet 222, which in the case of {100} cubic semiconductors (e.g., silicon) is also a {110} plane providing a 45° inverted angle relative to the <100> top surface 106. Third and fourth waveguides may each further include an end facet corresponding to the two sides of the recess orthogonal to the mirror facets 221 and 222. As one example, these plurality of waveguides having co-located end facets may then be utilized as a spot size converter (e.g., ~4× for four waveguides) with each facet collecting (or emitting) a portion of incident light with the plurality of waveguides then either optically added prior to coupling into an optical device (e.g., a photodetector) or each of the plurality of waveguides routed to separate optical devices (e.g., photodetectors).

Disposed under the device layer is a thin film dielectric layer 205B. Generally, the dielectric layer 205B may be any material known in the art to have sufficient index contrast with the waveguide 210 for mode confinement. In certain embodiments illustrated by FIG. 2A, the dielectric layer 205B is further to provide sufficient etch selectivity to the device layer 205C that the dielectric layer 205B may be undercut as a means of fabricating the mirror facet 221, as is described further elsewhere herein. In embodiments, the dielectric layer 205B comprises silicon oxide, and in the exemplary embodiment the dielectric layer 205B is silica ($SiO_2$). As shown in FIG. 2A, the dielectric layer 205B forms a sidewall 223 recessed from the top mirror edge 220 by an amount approximately equal to the thickness of the device layer 205C. For example where the thickness of the device layer $T_1$ is approximately 20 μm, the dielectric layer 205B is recessed laterally (along the x-dimension) from the top mirror edge 220 by approximately 20 μm.

For the vertical coupler 201, the device layer and the dielectric layer 205B are both disposed over a substrate 205A. The substrate 205A may be of any material known in the art, including, but not limited to, semiconductors or dielectrics, whether single crystalline, polycrystalline or glass. In one exemplary embodiment, the substrate 205A is single crystalline semiconductor, such as silicon. For certain embodiments, the vertical coupler 201 is formed in an semiconductor on insulator (SOI) substrate (e.g., with the device layer 205C and substrate 205A each being silicon, and the dielectric layer 205B being silicon dioxide).

As illustrated in FIG. 2B, in embodiments an anti-reflective coating (ARC) layer 290 is disposed over the device layer top surface 206. In general, the ARC layer 290 may be disposed anywhere over the device layer 205C, but is particularly advantageous when disposed on the optical waveguide 210 proximate to the end facet serving as the mirror facet 221 (i.e., over the waveguide portion 210B). The ARC layer 290 may be of any material known in the art to suppress reflection over a given band of wavelengths for the given refractive index of the device layer semiconductor. In certain embodiments where the device layer 205C is silicon, the ARC layer comprises silicon nitride ($Si_3N_4$) or $SiO_xN_y$.

In further embodiments illustrated by FIG. 2B, an occlusion material 275 is disposed over the recess etched into the device layer 205C. The occlusion material 275 seals, or occludes, two opposites sides of the recess (e.g., mirror facet 221 and opposing facet 222) and/or edges of polygonal opening 260 in the device layer top surface 206. In the exemplary embodiments, the occlusion material has sufficient index contrast with the device layer 205C that TIR is maintained even where the occlusion material is disposed on the mirror facet 221. For example, in certain embodiments where the device layer 205C is silicon, at least a base layer of the occlusion material 275 is silica. As shown in FIG. 2B, the occlusion material 275 may or may not form a key hole or void 280 within the device layer recess. The occlusion material 275 may be planar with the device layer top surface 206 (e.g., as polished back after deposition) and the ARC layer 290 optionally disposed thereon.

Figure 3:
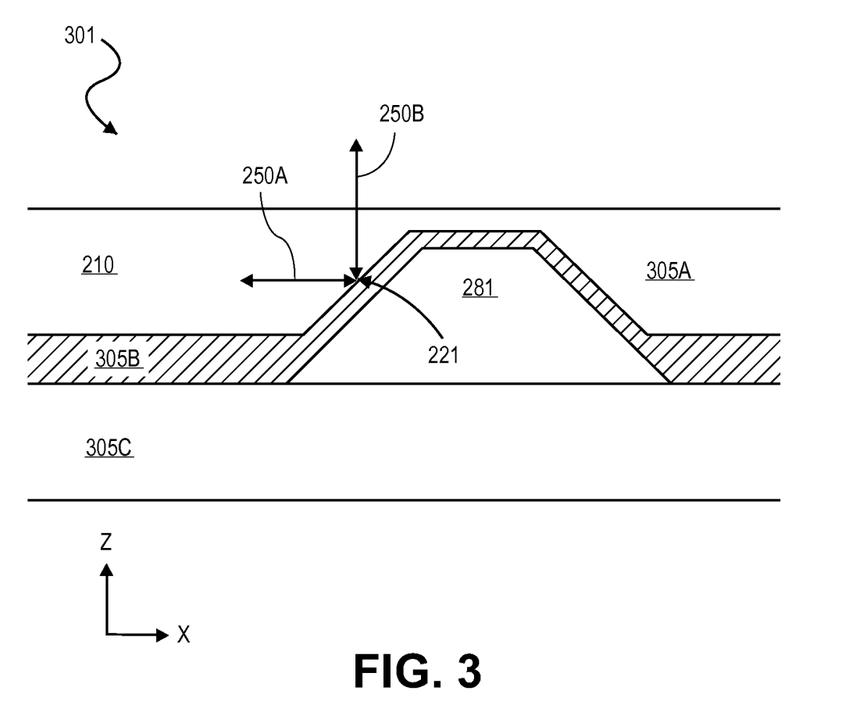
FIG. 3 is a cross-sectional view a vertical coupler employing an inverted mirror facet 221 in accordance with an embodiment of the present invention.

FIG. 3 is a cross-sectional view of a vertical coupler 301 including an optical waveguide 210 and an inverted mirror facet 221 in accordance with an embodiment of the present invention. In this embodiment, at least a partial thickness of a thin film dielectric 305B is present over the mirror facet 221. Generally, the device layer 305A may be any of the materials described elsewhere herein in the context of the device layer 205C in FIGS. 2A-2C. In particular embodiments, the device layer 305A is crystalline silicon having a <100> orientation. For certain embodiments where the device layer 305A is <100> silicon and the mirror facet 221 is a {110} crystal plane, the thin film dielectric 305B is silica-based, and index contrast is sufficient for TIR at the 45° oriented mirror facet 221. As further shown in FIG. 3, portions of the device layer 305A opposite the facet 221 are in direct contact with the waveguide 210, forming a continuous bridge or membrane of semiconductor material over the void 281. The lack of an opening in the top surface 306 of the device layer 305A is indicative of the facet 221 having been made prior to joining the device layer 305A to the substrate 305C. In other embodiments, the device layer 305A may be sufficiently thin, or the facet 221 of sufficient depth, that the thin film dielectric 305B serves as the only occlusion material or membrane sealing the void 281.

Notably, where both a substrate and a device layer are of a same material (e.g., silicon) and both of a same crystal orientation (e.g., {100}), the substrate may have an etch pit including {110} crystal plane facets disposed below the {110} crystal plane. For example, as shown in FIG. 2A, facets 221 and 222 of the device layer are disposed over an etch pit having {110} crystal plane facets in the substrate 205A. Such a recess into the substrate 205A may be avoided as illustrated in FIG. 3, for example with impurity dopants in the substrate 205A (e.g., boron doping) or with particular fabrication techniques described elsewhere herein which utilize wafer bonding. Notably however, such substrate etch pits have not been found to be detrimental, even if they are nonfunctional within a PIC.

Figure 4A:
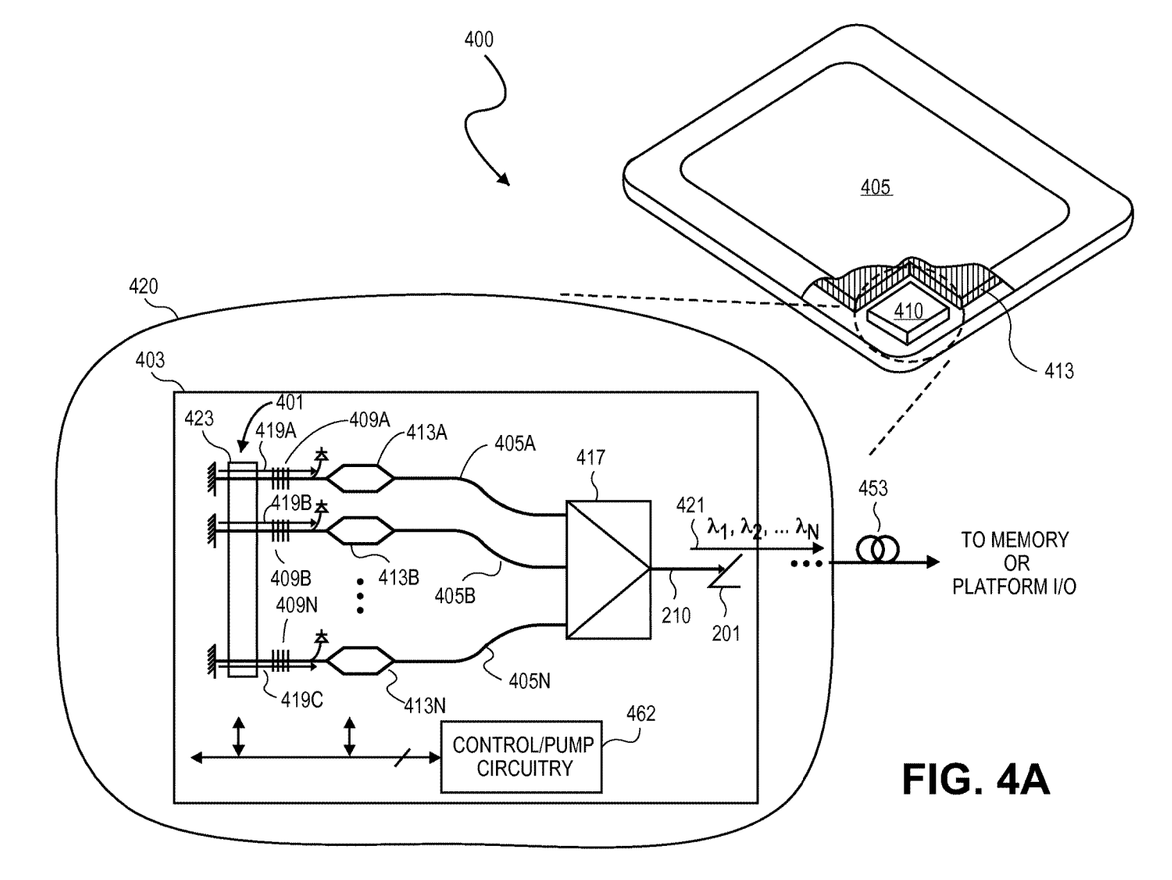
FIGS. 4A and 4B are functional block diagrams of a mobile computing platform including a photonic integrated circuit, including a vertical coupler employing an inverted mirror facet, in accordance with embodiments of the present invention.
Figure 4B:
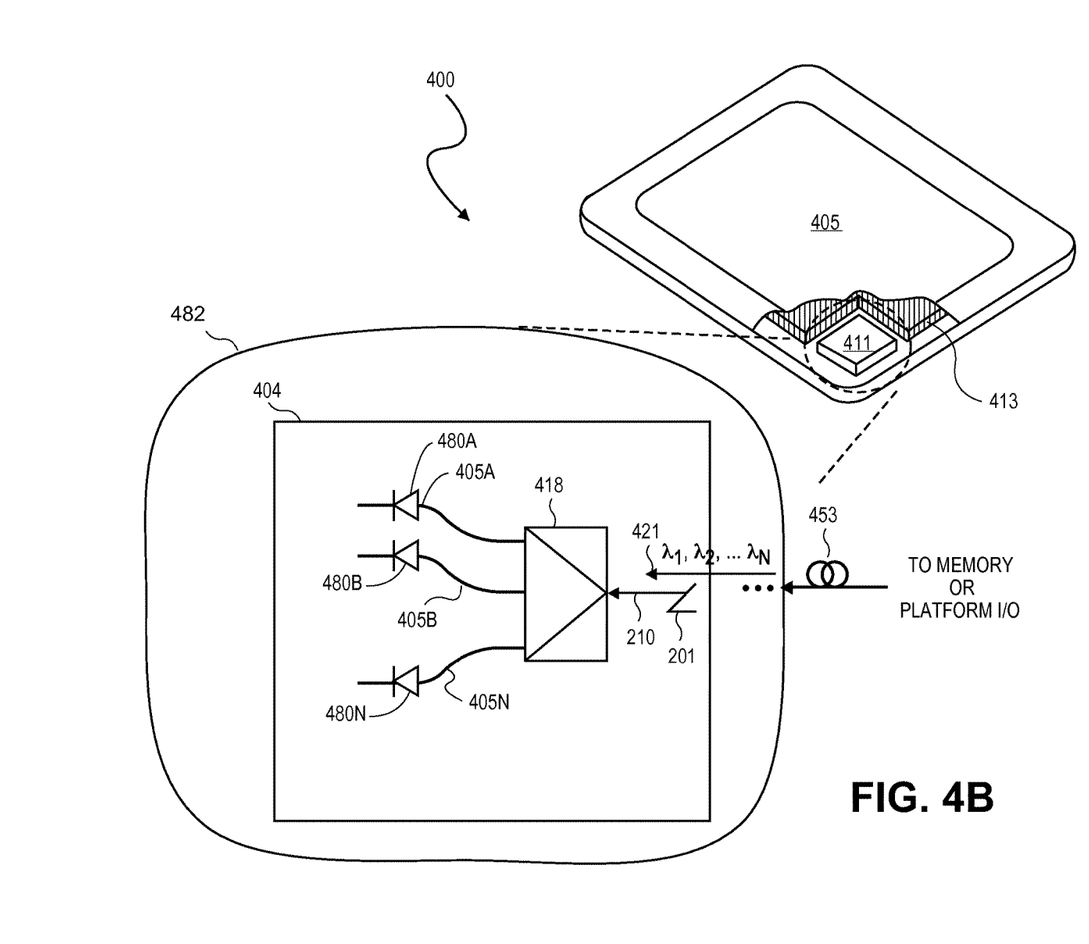

FIGS. 4A and 4B are functional block diagrams of a mobile computing platform including a photonic integrated circuit, including an optical waveguide and a vertical coupler employing an inverted mirror facet 201 in accordance with an embodiment of the present invention. Generally, the mirror facet 201 in FIG. 4A is employed in a transmitter embodiment while the mirror facet 201 is employed in a receiver embodiment. Either or both of the transmitter and receiver embodiments may be applicable to a same computing platform, for example. For both FIGS. 4A and 4B, a mobile computing platform 400 may be any portable device configured for each of electronic data display, electronic data processing, and wireless electronic data transmission. For example, the mobile computing platform 400 may be any of a laptop, a netbook, a notebook, an ultrabook, a tablet, a smart phone, etc. and includes a display screen 402, which may be a touchscreen (e.g., capacitive, resistive, etc.) the optical transmitter 410, and a battery 413.

Referring to FIG. 4A, the optical transmitter 410 is further illustrated in the expanded functional block view 420 illustrating an array of electrically pumped lasers 401 controlled by circuitry 462 coupled to a passive semiconductor layer over, on, or in, substrate 403. The semiconductor substrate 403 further includes a plurality of optical waveguides 405A-405N over which a bar of gain medium material 423 is bonded to create, along with the reflectors 409A-409N, an array of lasers that during operation generate a plurality of optical beams 419A-419N in the plurality of optical waveguides 405A-405N, respectively. The plurality of optical beams 419A-419N are modulated by modulators 413A-413N and selected wavelengths of the plurality of optical beams 419A-419N are combined with optical multiplexer 417 to output a single optical beam 421 propagated through waveguide 210 to a vertical coupler 130 employing the inverted mirror facet 201 into the waveguide 210, substantially as described elsewhere herein in the context of FIGS. 2A and 2B, and into an optical wire 453. The optical wire 453 is further coupled to a downstream optical receiver that is external to the mobile computing platform 400 (i.e., coupled through the platform optical I/O terminal) or internal to the mobile computing platform 400 (i.e., a memory module). In certain embodiments, the vertical coupler 130 employing the inverted mirror facet 201 is capable of transmitting data at the multiple wavelengths included in the optical beam 421 over the single optical wire 453 at speeds of at least 25 Gb/s and potentially more than 1 Tb/s.

Referring to FIG. 4B, the computing platform 100 includes an optical receiver 411 further illustrated in the expanded functional block view 482. The optical wire 453 inputs a single optical beam 421 which is optically coupled through a vertical coupler employing the inverted mirror facet 201 into the waveguide 210, substantially as describe elsewhere herein in the context of FIGS. 2A and 2B. Selected wavelengths are then separated with an optical demultiplexer 418 to output to a plurality of optical waveguides 405A-405N disposed on a substrate 404 (which is the same substrate as substrate 403 for a transceiver chip embodiment). The plurality of optical waveguides 405A-405N are further coupled to an array of photodetectors (e.g., PIN photo diodes) 480A, 480B, 480N which are in turn electrically coupled to downstream integrated circuitry.

Figure 5:
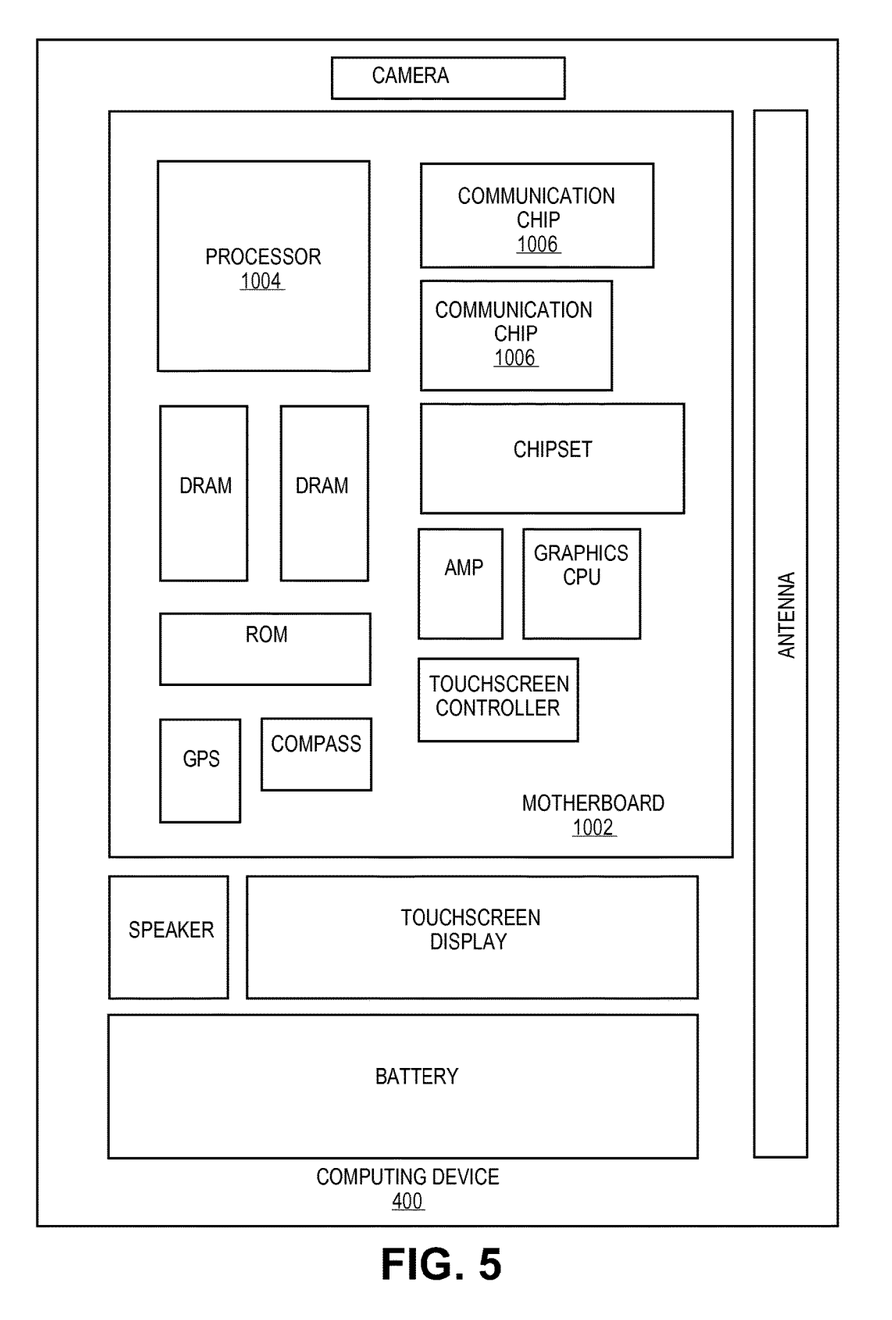
FIG. 5 is a functional block diagram of the mobile device illustrated in FIG. 4, in accordance with an embodiment of the present invention.

FIG. 5 is a functional block diagram of the mobile computing device 1000 in accordance with certain embodiments of the invention. The mobile computing device 1000 may be disposed in the mobile computing platform 400 and may further include a number of components, including but not limited to a processor 1004 (e.g., an applications processor) and at least one communication chip 1006. The processor 1004 is physically and electrically coupled to a board 1002. In some implementations the at least one communication chip 1006 is also physically and electrically coupled to the board 1002. In further implementations, the communication chip 1006 is part of the processor 1004. Depending on its applications, mobile computing device 1000 may include other components on the board 1002. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth).

At least one of the communication chips 1006 enables wireless communications for the transfer of data to and from the mobile computing platform 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The mobile computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 includes an integrated circuit die packaged within the processor 1004. The term "processor" may refer to any device or portion of a device that processes electronic data from registers and/or memory to transform that electronic data into other electronic data that may be stored in registers and/or memory. In embodiments, one or more of the communications chip 1006 or processor 1004 incorporates the inverted 45° mirror, substantially as described elsewhere herein. Of course, any other integrated circuit chips employing optical waveguides may similarly incorporate the inverted 45° mirror, substantially as described elsewhere herein.

Figure 6:
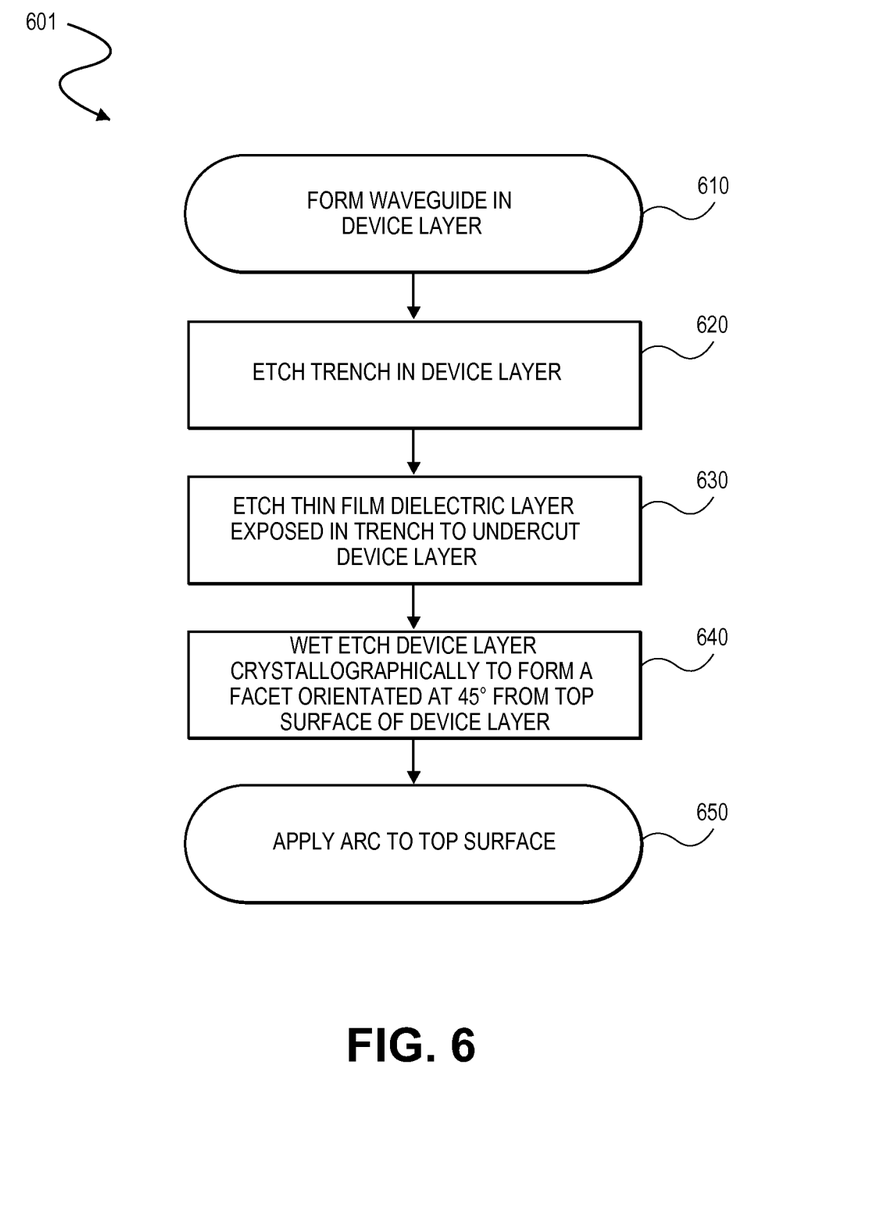
FIG. 6 is a flow diagram illustrating a method of manufacturing a mirror facet in a photonic integrated circuit, in accordance with an embodiment of the present invention.
Figure 7:
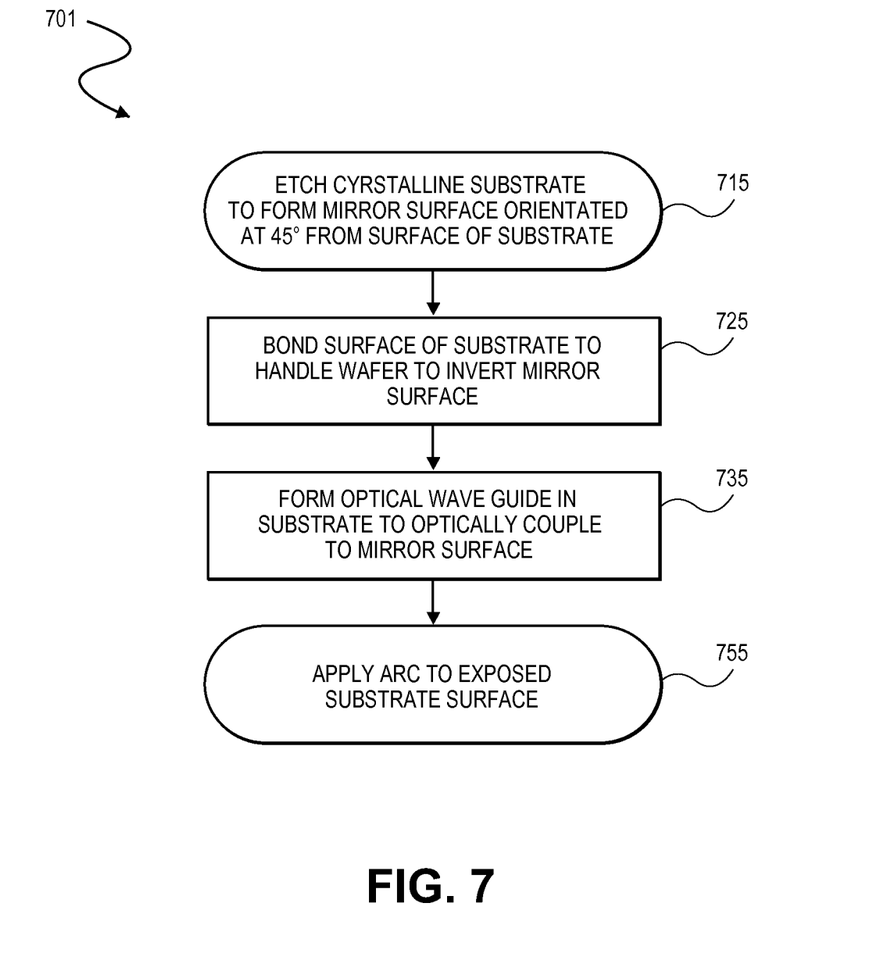
FIG. 7 is a flow diagram illustrating a method of manufacturing a mirror facet in a photonic integrated circuit, in accordance with an embodiment of the present invention.

With the device and system-level architectures described, methods for forming the exemplary vertical couplers 201 and 301 are now described in reference to FIGS. 6 and 7 illustrating high level operations which may each further include a number of separate processing operations, as known in the art. No order is to be implied by the relative position of the operations in FIGS. 6 and 7, however the arrows in the flow chart are merely one exemplary sequence which may be altered in other embodiments. An order of operations may also be implicit where one operation necessarily operates on the output of another operation.

FIG. 6 is a flow diagram illustrating a method 601 for manufacturing a mirror facet in a photonic integrated circuit, in accordance with an embodiment of the present invention. Generally, the method 601 entails processing an SOI substrate to form a waveguide with a 45° end facet to form structures as illustrated in FIGS. 2A-2C. The method 601 begins at operation 610 with formation of a waveguide in a semiconductor device layer disposed over a thin film dielectric layer of a substrate as a functional region of an optical transmitter PIC chip. Patterning of the waveguide is such that an end portion of the waveguide is oriented at a 45° degree angle so that the direction of light propagation along at least the end portion will be in a <100> direction. Any techniques known in art, such as photolithography and anisotropic silicon plasma etch, etc. may be utilized to form the waveguide (e.g., the waveguide 210 in FIGS. 2A and 2B). For example, in certain embodiments, a silicon layer of a silicon-on-insulator (SOI) substrate is etched to define horizontal sidewalls of the waveguide.

At operation 620, a trench is etched into the device layer at a 90° orientation relative to the <100> directed end portion of the waveguide. For example, a polygon in a mask material may be patterned to have an edge normal to a <100> direction of the device layer. As defined by the polygonal mask opening, a trench is formed through the entire thickness of the device layer with one side of the trench being at right angles with the <100> direction. Generally, the trench etch at operation 620 is non-crystallographic and more specifically dose not form facets along {110} crystal planes. In embodiments, the trench may be formed concurrently with definition of the waveguide (i.e., same mask) or with a separate masking level. Preferably a dry etch, such as the type used to delineate the waveguide is employed at operation 620. In certain embodiments, a silicon layer of a silicon-on-insulator (SOI) substrate is etched to define the trench. In certain embodiments, the trench etched through the device layer stops on the underlying thin film dielectric (e.g., the buried insulator of the SOI substrate).

At operation 630, the thin film dielectric layer exposed by the trench (for example within the polygon 260 of FIG. 1) is etched so as to undercut the device layer (for example as is illustrated in FIG. 2A). In certain embodiments, an anisotropic dry etch of the thin film dielectric layer is performed to propagate the trench through the entire thickness of the thin film dielectric layer. Following the dry etch, a wet or dry isotropic etch of the thin film dielectric layer is performed to recess the dielectric layer relative to the overhanging device layer. A timed wet etch, for example with a HF-based etchant may be well controlled to recess the sidewalls of the thin film dielectric layer by a predetermined amount. In an alternative embodiment, only a wet or dry isotropic etch of the thin film is performed to recess the dielectric layer relative to the overhanging device layer by a predetermined amount.

At operation 640, the device layer is crystallographically etched to form a recess with at least one facet oriented 45° from a top surface of the device layer. The crystallographic etchant may be any known in the art that is preferential to crystal planes oriented 45° (i.e., 45° plane is the slowest etching) from the top surface of the device layer. In the exemplary embodiment with a {100} oriented silicon SOI substrate, the etchant may be any known in the art to be slowest for {110} crystal planes. In one such embodiment, the crystallographic etch of operation 640 comprises exposing a {100} oriented crystalline silicon device layer to an etchant solution comprising KOH and isopropyl alcohol (IPA) and removing crystalline semiconductor to form a {110} facet of desired dimensions. Good results have been found with a mixture of 10M KOH and IPA at 60° C. In further embodiments, a non-ionic surfactant, such as, but not limited to, Triton X-100 (C14H22O(C2H4O)n), may also be included in the etchant.

The method 601 then completes at operation 650 with application of an ARC layer to a top surface of the device layer. For example, any of the ARC layer materials described elsewhere herein may be deposited by chemical vapor deposition (CVD) or plasma enhanced CVD (PECVD), or the like. Prior to, subsequently to, or concurrently with ARC layer formation, the recess is sealed or occluded with an occlusion layer, again by a CVD or PECVD process, for example. One or more planarization operations may also be performed at operation 650. For example, after depositing the occlusion layer, a polish (e.g., CMP) may planarize the occlusion material with a top surface of the device layer. The ARC layer may then be deposited upon this planarized layer.

FIG. 7 is a flow diagram illustrating a method 701 for manufacturing a mirror facet in a photonic integrated circuit, in accordance with an embodiment of the present invention. Generally, the method 701 entails processing a bulk substrate to form a 45° end facet. The bulk substrate is then bonded with a handling wafer to invert the 45° end facet relative to a waveguide formed in the substrate after the substrate is thinned to form structures as illustrated in FIG. 3.

Specifically, the method 701 begins at operation 715 with etching a crystalline semiconductor substrate, for example a {100} silicon substrate, to form facets oriented at 45° from a top surface of the substrate. Relative to the etching operation 640, the etching operation 715 is more flexible in that both wet crystallographic etching as well as techniques employing grayscale lithography can be utilized at operation 715 because the 45° faceting is to be positively sloped (i.e., not re-entrant). As such, many known crystallographic etchants may be utilized with the KOH/IPA embodiment described in the context of FIG. 6 being one of them. Grayscale lithography embodiments may entail any such technique known in the art and in certain embodiments a crystallographic etchant may be further utilized subsequent to transferring a grayscale mask pattern into the semiconductor substrate to remove crystalline semiconductor and form a {110} facet of desired dimensions. Notably, where grayscale lithography is employed, the substrate need not be a {100} silicon substrate and orientation of the mask pattern need not be rotated to have a polygon edge extending along a (100) direction as for the method 601. For this reason, operation 715 is also more flexible with respect to the location and orientation of the mirror surfaces formed relative to operation 640 (FIG. 6).

With the 45° mirror surfaces formed at operation 715, the method 701 proceeds to operation 725 where a top surface of structured substrate is bonded to a top surface of a handle wafer to begin a layer transfer process. The bonding inverts the mirror surface(s) etched at formed at operation 715. For example, as shown in FIG. 3, the device layer 305A may be a transferred to a handle substrate after having a recess etched at operation 715. Generally, any bonding technique known in the art may be employed at operation 725. In certain embodiments, the top surface of the device layer is oxidize, or an oxide is deposited over the device layer) and this oxide is thermally and/or pressure bonded to an oxidized surface of a handle wafer (e.g., an oxidized silicon wafer). A conventional grinding or and/or etch back process then thins and/or planarizes the structured substrate into a device layer.

At operation 735, an optical waveguide is then formed in the device layer using any of the techniques described in the context of operation 610 (FIG. 6). Generally, the optical waveguide is to be optically coupled to 45° mirror surface with the mirror surface for example forming an end of the waveguide. The method 701 then completes with application of an ARC layer to the exposed substrate surface at operation 755. Any of the techniques described in the context of operation 650, or any technique conventional in the art, may be utilized at operation 755.

Many exemplary embodiments have been described herein. One embodiment includes a photonic integrated circuit (PIC) with a thin film dielectric layer disposed over a substrate, a {100} crystalline device layer disposed over the thin film dielectric layer, and an optical waveguide formed in the device layer, wherein a {110} crystal plane of the device layer forms an end facet optically coupled the optical waveguide. In further embodiments, the end facet has an index contrast with an interfacing media sufficient for the {110} crystal plane to induce internal reflection of an optical mode propagated by the waveguide into a <100> direction. In further embodiments, the waveguide is to propagate the optical mode in a first of the <100> directions, toward or away from the end facet, and the end facet is to reflect the optical mode, into or from, a second of the <100> directions. In further embodiments, the {110} crystal plane is reentrant from a top surface of the device layer. In further embodiments, an anti-reflective coating (ARC) layer is disposed on the device layer and over the optical waveguide proximate to the end facet. In further embodiments, the end facet is one side of a recess etched into the device layer, with the recess having a plurality of sides defined by a plurality of {110} crystal planes. In further embodiments, an occlusion material is disposed over the recess, with the occlusion material sealing two opposite sides of the recess. In further embodiments, a sidewall of the thin film dielectric layer intersects the {110} crystal plane and the substrate has an etch pit including a {110} crystal plane facet disposed below the {110} crystal plane of the device layer. In further embodiments, the thin film dielectric is disposed over the {110} crystal plane, the substrate is crystalline silicon, the device layer is crystalline silicon, and the dielectric layer comprises silicon.

In other embodiments, a photonic integrated circuit (PIC) includes a thin film dielectric layer disposed over a substrate, a crystalline semiconductor device layer disposed over the thin film dielectric layer, and an optical waveguide formed in the device layer to propagate an optical mode in first directions substantially parallel to a top surface of the device layer, with the optical waveguide including a crystalline end facet formed in the device layer to reflect the optical mode to and from second directions substantially normal to the top surface of the device layer and with the end facet being a crystal plane oriented 45° from the first and second directions. In further embodiments, the top surface of the device layer is a {100} crystal plane and the end facet is a {110} crystal plane of the device layer. In further embodiments, the {110} crystal plane is reentrant from the top surface of the device layer and the end facet has an index contrast with an interfacing media sufficient for the {110} crystal plane to induce internal reflection of the optical mode through the device layer.

In other embodiments, a method of forming a mirror in a photonic integrated circuit (PIC) includes forming an optical waveguide in a crystalline semiconductor device layer disposed over a thin film dielectric layer of a substrate, etching a trench through the device layer, etching the thin film dielectric layer exposed by the trench to undercut the device layer, and performing a crystallographic wet etch of the device layer exposed by the etching of the thin film dielectric to form a facet oriented 45° from a top surface of the device layer that is optically coupled to the waveguide. In further embodiments, the device layer is has cubic crystallinity with a {100} plane forming the top surface of the device layer and the facet is a {110} crystal plane and the device layer is silicon, performing the crystallographic wet etch further includes exposing the device layer to an etchant solution comprising KOH and isopropyl alcohol (IPA). In embodiments, etching the trench further includes forming a polygon in a mask material, the polygon having an edge normal to a <100> direction of the device layer, and non-crystallographically etching the device layer exposed within the polygon.

In embodiments, a method of forming a mirror in a photonic integrated circuit (PIC), the method includes forming an optical waveguide in a crystalline semiconductor device layer disposed over a thin film dielectric layer of a substrate, etching a trench through the device layer, etching the thin film dielectric layer exposed by the trench to undercut the device layer, and performing a crystallographic wet etch of the device layer exposed by the etching of the thin film dielectric to form a facet oriented 45° from a top surface of the device layer that is optically coupled to the waveguide. In further embodiments, the device layer is has cubic crystallinity with a {100} plane forming the top surface of the device layer and the facet is a {110} crystal plane, the device layer is silicon, and performing the crystallographic wet etch further includes exposing the device layer to an etchant solution comprising KOH and isopropyl alcohol (IPA). In further embodiments, etching the trench further includes
 forming a polygon in a mask material, the polygon having an edge normal to a <100> direction of the device layer, and non-crystallographic ally etching the device layer exposed within the polygon.

In embodiments, a method of forming a mirror in a photonic integrated circuit (PIC) includes performing an etch of a crystalline semiconductor substrate to form a facet oriented 45° from a top surface of the substrate, bonding the top surface of the substrate to a handle wafer, and forming, in the substrate, an optical waveguide that is optically coupled with the facet. In a further embodiment, the method further includes oxidizing the top surface of the substrate and the facet prior to the bonding and forming the optical waveguide further includes thinning the substrate to form an device layer, and etching a portion of the device layer to define the waveguide.

In embodiments, a mobile computing platform includes a processor, a memory, a display, and a photonic integrated circuit (PIC) chip further including a photodetector optically coupled to a first end of an optical waveguide formed in a device layer disposed over thin film dielectric layer of a substrate, and a crystalline end facet formed in the device layer and optically coupled to a second end of the optical waveguide to reflect light propagated from a direction substantially normal to the top surface of the device layer, to a direction that is propagated toward the photodetector, wherein the end facet is a crystal plane oriented 45° from normal to the top surface. In further embodiments of the computing platform, the PIC chip further comprises a laser optically coupled to the end facet. In further embodiments of the computing platform, a {110} crystal plane of the device layer forms the end facet.

It will be recognized that the invention is not limited to the embodiments so described, but can be practiced with modification and alteration without departing from the scope of the appended claims. The scope of the invention should, therefore, be determined with reference to the appended claims, along with the full scope of equivalents to which such claims are entitled.

What is claimed is:

1. A photonic integrated circuit (PIC), comprising:
   a {100} crystalline device layer disposed over a substrate;
   a thin film dielectric layer disposed over the {110} crystal plane; and
   an optical waveguide formed in the device layer, wherein the {110} crystal plane of the device layer forms an end facet optically coupled to the optical waveguide and oriented 45° with respect to a top surface of the substrate, and further wherein the device layer with the end facet and portions of the device layer opposite the end facet being in direct contact with the optical waveguide form a bridge over a void located over the substrate and beneath the dielectric layer.

2. The PIC of claim 1, wherein the substrate is crystalline silicon, the device layer is crystalline silicon, and the dielectric layer comprises silica.

3. A method of forming a mirror in a photonic integrated circuit (PIC), the method comprising:
performing an etch of a crystalline semiconductor substrate to form a facet oriented 45° from a top surface of the substrate;
bonding the top surface of the substrate to a handle wafer; and
forming, in the substrate, an optical waveguide that is optically coupled with the facet.

4. The method of claim 3, further comprising oxidizing the top surface of the substrate and the facet prior to the bonding.

5. The method of claim 3, wherein forming the optical waveguide further comprises:
thinning the substrate to form an device layer; and
etching a portion of the device layer to define the waveguide.

6. A mobile computing platform comprising:
a processor;
a memory;
a display; and
an photonic integrated circuit (PIC) chip comprising
a {100} crystalline device layer disposed over a substrate,
a thin film dielectric layer disposed over the {110} crystal plane, and
an optical waveguide formed in the device layer, wherein the {110} crystal plane of the device layer forms an end facet optically coupled to the optical waveguide and oriented 45° with respect to a top surface of the substrate, and further wherein the device layer with the end facet and portions of the device layer opposite the end facet being in direct contact with the optical waveguide form a bridge over a void located over the substrate and beneath the dielectric layer.

7. The computing platform of claim 6, wherein the PIC chip further comprises a laser optically coupled to the end facet.

8. The computing platform of claim 6, wherein a {110} crystal plane of the device layer forms the end facet.

* * * * *